United States Patent

Havens

[15] 3,688,219

[45] Aug. 29, 1972

[54] ELECTRICALLY AND MECHANICALLY TUNABLE MICROWAVE POWER OSCILLATOR

[72] Inventor: Richard Calvin Havens, Scottsdale, Ariz.

[73] Assignee: Motorola, Inc., Franklin Park, Ill.

[22] Filed: Oct. 28, 1970

[21] Appl. No.: 84,640

[52] U.S. Cl.....................331/107 R, 331/96, 333/83

[51] Int. Cl...............................................H03b 7/06

[58] Field of Search.........................331/96, 107, 117

[56] References Cited

UNITED STATES PATENTS

| | | | |
|---|---|---|---|
| 3,246,266 | 4/1966 | Racy | 331/117 |
| 3,414,841 | 12/1968 | Copeland | 331/96 |
| 3,416,098 | 12/1968 | Vane | 331/96 |
| 3,443,244 | 5/1969 | Cook | 331/96 |
| 3,593,192 | 7/1971 | Nagano | 331/96 |

*Primary Examiner*—John Kominski
*Attorney*—Mueller & Aichele

[57] ABSTRACT

A high efficiency, negative resistance microwave power oscillator is disclosed which is tunable over a wide frequency range by applying a variable voltage to a varactor which is coupled to the resonant cavity of the oscillator and also by varying the size of the cavity as by moving a part of the floor thereof with respect to the negative resistance diode contained in the cavity. The power output and the electronic tuning sensitivity change little over the mechanical tuning range.

16 Claims, 1 Drawing Figure

Patented Aug. 29, 1972 3,688,219
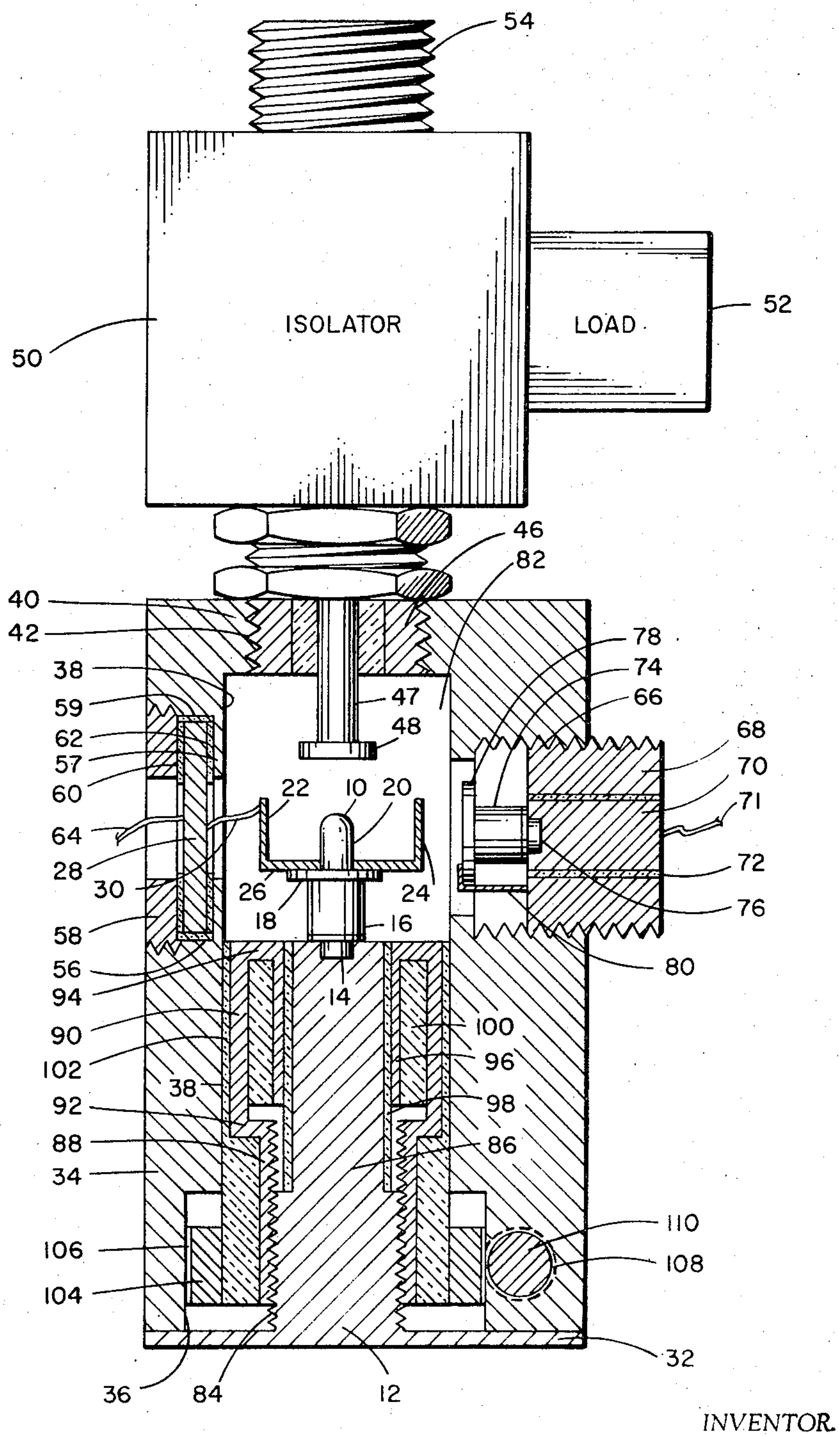
INVENTOR.
Richard C. Havens
BY Mueller & Aichele
ATTY'S

ELECTRICALLY AND MECHANICALLY TUNABLE MICROWAVE POWER OSCILLATOR

BACKGROUND

Prior art microwave oscillators are known in which a diode in a resonant chamber provides a negative resistance and in which the size of the chamber is varied to change the tuning. In these known devices, the power output of the oscillator varies substantially with tuning and it is quite difficult to adjust the frequency of the oscillator closely, since the frequency varies non-linearly with the tuning adjustment thereof.

It is an object of this invention to provide a power oscillator which produces waves in the microwave range which can be tuned closely to a desired output frequency.

It is another object of this invention to provide a power oscillator in the microwave range whose power output does not vary greatly as the frequency changes.

It is still another object of this invention to provide a microwave power oscillator combining mechanical and electronic tuning whereby the frequency of the output wave can be tuned closely without greatly varying the power output of the oscillator.

It is a further object of this invention to provide a microwave power oscillator having a greater useful mechanical frequency tuning bandwidth than known such oscillators.

It is a still further object of this invention to provide a microwave power oscillator including a mechanical and an electronic tuning means in which the mechanical tuning thereof does not change the electronic tuning sensitivity thereof.

Another object of this invention is to provide a microwave power oscillator in which the above objects are realized without greatly reducing the efficiency of direct current to microwave oscillation conversion of the oscillator.

SUMMARY

In accordance with the invention, a diode is positioned in a resonant chamber or cavity and a tuning flange or disk is connected to the diode. Mechanical tuning is provided in that a wall of the chamber is moved with respect to the disk for tuning the chamber and therefore varying the output frequency. As another feature of the invention, a voltage variable capacitor or varactor is coupled to the chamber and its position with respect to the chamber and the coupling thereof to the chamber and the voltage applied to the varactor are separately variable. In this oscillator, the frequency can be closely tuned in a linear manner to a desired output frequency and the output power of the oscillator changes little. Furthermore, the sensitivity of varactor tuning, that is the frequency change per volt change of potential applied to the varactor, is nearly independent of the mechanical tuning of the oscillator. In this oscillator, the tuning range is greater than that previously attainable in such oscillators. It is thought that this wide tuning range is primarily because the mechanical tuning mainly effects the magnetic fields in the cavity and that the power output coupling is primarily by electric field therein so that the mechanical tuning does not greatly affect the power output of the oscillator.

DESCRIPTION

The invention will be better understood upon reading the following description in connection with the accompanying drawing in which the FIGURE is a side elevational view, partly in cross section, of an oscillator embodying this invention.

A negative resistance diode 10 is mounted on a post 12. The diode 10 is an article of commerce and includes a small cylindrical portion 14 which is held in a hole or cavity in the center of the top of the post 12. The diode 10 further includes a larger cylindrical body portion 16 and an intermediate flange 18, and a top cylindrical portion 20 whose outer end is rounded and whose diameter is less than the diameter of the cylindrical portion 16. A tuning flange 22 fits around the cylindrical portion 20 of the diode 10 and rests on and may be soldered to the flange 18. The disk or flange 22 is hollowed out to provide a dish-like structure comprising a thin walled cylinder 24 joined at the lower end to a thin disk 26. The tuning flange 22 has a diameter nearly as great as the diameter of the hole 38 in a chamber member 34, whereby the outside of the cylinder 24 is in close proximity to the wall of the resonant chamber 82, as will be described. It has been found that nearly three times as much power is produced by providing such a flange 22 rather than one which is of the diameter of the flange 18 on the diode 10 and extends towards the conductive flange 48 to be described. It is thought that this is due to the fact that vertical alignment of the electric field lines of force in the resonant chamber occur between the floor of the cavity 82 and the bottom of the disk 22. The flange 22 is shown in its hollowed form rather than being solid to reduce its weight to thereby reduce any change in operation thereof by application thereto of a physical shock. A shock of 6,000 G's was applied to an oscillator such as here disclosed without causing any noticeable change in power output or in the frequency thereof. The tuning flange 22 is connected to a conductive disk 28 by means of a conductor 30 whose purpose is to be described.

A flange 32, which may be an integral part of the post 12 comprises a closure for the chamber member 34. Chamber member 34 has a hole 36 of circularly cylindrical form part way up from the bottom of the member 34. A smaller diameter cylindrical hole 38 extends upward from the hole 36 and ends leaving a top wall 40. The top wall 40 has a threaded hole 42 therethrough and into which the outer conductor of an output concentric conductor 46 is threaded. The inner conductor 47 of the concentric conductor extends into the hole 38 and ends in the circular flange 48 spaced from the diode 10, and from the flange 22. As noted, the diode 10, the flange 22 and the conductor 46 are centrally located in the hole 38 along the axis thereof. A ferrite isolator 50 of known design is fixed to the outer connector 46 in a known manner, a load 52 being an integral part thereof. A stud 54 extending from the isolator 50 is a coaxial output connection therefor, and may be connected to the load to be supplied by the described oscillator.

A disk 28 is tightly held in a hole 56 and up against an abutment 57 in the side of the chamber member 34 by a threaded washer 58. The disk 28 is insulated from the member 34 by cylindrical insulation 59 and washer-shaped insulation 60 and 62. A conductor 64 is conductively fixed to the disk 28 for application thereto of supply voltage for the diode 10.

Another threaded hole 66 is provided in the side of the member 34. While the holes 56 and 60 are shown to be in axial alignment with each other, they may be positioned at any desired angle about the circumference of the cylindrical hole 38. A conductive plug 68 is threaded into the hole 66. The center portion 70 of the plug 68 is conductive and is insulated from the remainder of the plug 68 by insulation 72. A voltage variable capacity diode 74 is mounted on the center portion 70 of the plug 68, the cylindrical end 76 of the diode 74 being received in a hole in the center portion 70, whereby one terminal of the diode 74 is connected to the center portion 70. The other connection of the diode 74, comprising the flange 78, is connected to the plug portion 68 by a conducting ribbon 80. By rotating the plug 68, the diode 74 can be brought closer to or taken further from the flange 24 and also the angular position of the ribbon 80 with respect to the flange 24 is adjustable.

While the top of the post 12 and therefore the diode 10 and the flange 22 are fixed with respect to the top wall 40 of the hole 38, an annular portion of the floor of the resonant chamber 82 comprising the upper portion of the hole 38 is moveable up and down with respect to the flange disk 26. To cause such an adjustment, the lower part 84 of the post 12 is threaded and is of a larger diameter than the upper part 86 thereof. An internally threaded metallic member 88 is threadedly engaged with the threaded portion 84 and extends above the threaded portion 84. The upper end portion 90 of the threaded member 88 is not threaded and has a larger inner and outer diameter than the diameter of the threaded portion of the member 88. A radially extending washer 92 connects the threaded portion of the member 88 to the upper end portion 90 thereof. An inwardly extending washer 94 is fixed to the upper end portion 90 and joins it to an inner cylindrical portion 96. The cylindrical portion 96 is not as long as the end portion 90 and the cylindrical portion 96 is insulated from the post 12 above the threaded part 84 thereof by a cylindrical insulator 98. Thicker insulation 100 is included between the end portion 90 and the cylindrical portion 96. For ease of manufacture and assembly, the threaded member 88 which includes the washers 92 and 94 and the end member 90 and the cylindrical member 96 may be made of as many parts as is convenient instead of one piece as shown. An insulator 102, which has a uniform outer diameter and is stepped in inner diameter fits in the hole 38 and extends part way down into the hole 36. The insulator 102 embraces the threaded member 88 and is firmly attached thereto.

A threaded ring 104 is securely fixed to the insulator 102 in the hole 36. The axial length of the ring 104 is less than the axial length of the hole 36. Threads 106 of the worm wheel type are provided on the external periphery of the ring 104 and they mesh with the worm threads 108 of a worm gear 110. The gear 110 is rotatable in a hole in the member 34, whereby upon tuning the gear 110, the ring 104 turns, which turns the insulator 102 and the threaded member 88. The threaded member 88, while rotating moves up and down with respect to the post 12, whereby the top portion 94 moves up and down changing the distance between the top of the washer 94 and the bottom of the flange 22 and mechanically changing the tuning of the described oscillator.

The operation of the described oscillator is as follows. A direct voltage is applied to the conductor 64 with respect to ground, which is the post 12, this voltage being great enough to break down the diode 10, whereby a negative resistance appears in the chamber 82 and oscillations determined by the resonant structure as will be described, occur in the chamber 82. These oscillations are picked up by the flange 48 and carried to the load (not shown) connected to the output connector 54 by way of the isolator 50 by the concentric line comprising the connector 46 and the inner conductor 47.

As stated above, mechanical tuning of the oscillator frequency is accomplished by turning the worm gear 110. This mechanical tuning provides a 20 percent change in frequency with little change in power output. Electrical tuning thereof is accomplished by varying the voltage applied across the varactor diode 74 by varying the voltage that is applied to the conductor 71, which is conductively connected to the inner portion 70, with respect to ground which comprises the post 12 or the cavity member 34. As is known, the capacity exhibited by the diode 74 changes as the voltage thereof changes. This changing capacity is coupled to the oscillations inside the chamber 82 since a loop comprising the conductive ribbon 80 is coupled to the magnetic lines of force in the chamber 82. The rotation of the plug 68 therefor varies the coupling between the varactor diode 74 and the magnetic lines of force in the chamber 82 both by angular position of the ribbon 80 and the magnetic lines of force and by bringing the ribbon 80 closer to or further away from the magnetic lines of force in the chamber 82. Hence, the amount of frequency change obtained per volt of voltage applied to the diode 74 can be adjusted by proper positioning of the diode in the chamber 82. Furthermore, as the plug 68 is threaded into the member 34, the losses in the diode 74 are increased since more energy is picked up by the ribbon 80. The voltage applied to the line 71 may be varied to provide frequency modulation of the oscillation frequency.

The tuning of the described oscillator is influenced more by the proximity of the periphery of the flange 22 to the inner surface of the hole 38 and by the proximity of the bottom of the disk 26 to the top of the washer 94 then it is by the distance between the top of the flange 24 and the upper wall of the chamber 82.

To provide smooth and linear tuning change as the worm gear 110 is rotated, the three coaxial lines comprising (1) the inside of the hole 38 and the threaded element 88, (2) the conductors 90 and 96 on both sides of the cylindrical insulator 100 and (3) the conductors 96 and 86, should have such a small diameter that when these coaxial transmission lines act as other than TEM wave guides, waves of the produced frequency cannot propagate therealong. The disclosed construction of the oscillator makes it possible to keep the diameters of the listed concentric lines sufficiently small.

The post 12 is of massive high heat conductivity material, and even though it is the inner conductor of a coaxial transmission line, the post 12 acts as a heat sink to withdraw enough heat from the diode 10 as to keep it within its operating temperature range.

A folded radial transmission line exists between the adjacent part of the abutment 57, and the washer 58 to the washer 28 that is about a quarter wave length long at the operating frequency. This quarter wave length line prevents radio frequency waves produced in the cavity 82 from leaking out. Due to the radial form of this transmission line, this line can have high capacity and therefore low impedance, since the washer 58 can be tightened to give good contact between the washer 58, the insulator 60, the washer 28, insulator 62 and the abutment 57. This fact can be contrasted with a transmission line such as is constituted by the plug 68 and the central portion 70 thereof, and which includes the insulator 72 wherein the capacity between the plug 68 and the portion 70 is determined when the plug 68 and the portion 70 and the insulator 72 are made, since neither part of the plug can be tightened against the other or against the insulation therebetween. The described folded radial mode transmission line bias circuit has proven to be superior to a concentric transmission line both in terms of eliminating RF leakage and in preventing bias circuit oscillations.

To prevent leakage of oscillations produced in the cavity into the tuning mechanism, the distance from the top to the bottom of the inner conductor 96 is equal to one quarter wave length of the produced wave in the dielectric material employed. Therefore, the quarter wave length line comprised of conductor 96 and conductor 90 has high impedance due to the thick insulation 100. Similarly, the length of the thick portion of the insulator 102 is a quarter wave length to provide a second high impedance line. The length of the thin portion of insulator 102 is also one quarter wave length.

The coaxial transmission lines comprising the inner cylindrical portion 96 and the upper part 86 of the post 12, as well as the coaxial transmission line comprising the upper end 90 of the threaded metallic member 88 and the chamber member 34 are each one quarter wave length long at an intermediate operating frequency of the described oscillator and include respective thin dielectrics 98 and 102. This construction including these concentric lines provides a very broad band, a non-contacting radio frequency short at the top of washer 94 to both the post 12 and the chamber member 34 which provides smooth mechanical frequency tuning (because of this absence of metal to metal contact), and contributes to the wide mechanical tuning range of the oscillator with little variation of power output thereof.

What is claimed is:

1. A negative resistance oscillator comprising a resonant chamber having a sidewall of predetermined lateral dimensions and two end walls longitudinally spaced from each other, a diode having two ends, means to hold said diode with one of its ends in a fixed position on one of said end walls of said chamber, and a tuning element conforming to the configuration of said sidewall and having a longitudinal dimension determined by the frequency of said oscillator mounted on said diode on the other one of its ends and extending in said lateral dimension to close proximity to said sidewall of said chamber to provide a thin annular gap between said tuning element and said sidewall for the extraction of R.F. power.

2. The negative resistance oscillator of claim 1 in which an output pick up conductor extends into said chamber from the other of its end walls into proximity with said annular gap for extracting R.F. power therefrom.

3. The negative resistance oscillator of claim 1 in which said one end wall has partially adjustable and partially fixed portions, said diode being fixed to said fixed wall portion.

4. The negative resistance oscillator of claim 2 in which said one end wall has partially adjustable and partially fixed portions, said diode being fixed to said fixed wall portion, said pick up conductor is positioned to couple out microwave energy primarily by coupling to the electric field in the resonant chamber on one side of said tuning element and in which said partially adjustable portion of said end wall is located primarily at a high magnetic field location in said resonant chamber at the other side of said tuning element.

5. The negative resistance oscillator of claim 1 in which a hole is provided in the wall of said chamber essentially at same longitudinal location as said tuning element and a voltage variable capacitor is mounted in said hole.

6. The negative resistance oscillator of claim 5 in which said voltage variable capacitor is a diode, and means are provided to supply voltage to said voltage variable diode with respect to said walls.

7. The negative resistance oscillator of claim 6 in which said means to supply voltage comprises a plug portion having a central portion insulated from the remainder of said plug portion, said voltage variable diode being mounted in said central portion adjacent said tuning element and a conductor connected between said voltage variable diode and said plug portion.

8. The negative resistance oscillator of claim 7 in which said plug and central portions are rotatably and transitionally mounted in a hole in the wall of said resonant chamber.

9. The negative resistance oscillator of claim 3 in which said moveable parts of said end wall surrounds said fixed part of said end wall.

10. The negative resistance oscillator of claim 3 in which said fixed part of said end wall is massive and acts as a heat sink.

11. The negative resistance oscillator of claim 10 in which means are provided for moving said moveable part of said end wall, said means for moving including electrical transmission lines for prevention of wave energy flow therealong in the transverse electric or transverse magnetic wave guide modes.

12. The negative resistance oscillator of claim 1 in which said chamber has a lateral wall and two end walls longitudinally spaced from each other and one of said end walls has partially adjustable and partially fixed portions, said diode being fixed to said fixed end wall portion and in which a hole is provided in the lateral wall of said chamber and a voltage variable capacitor is mounted in said hole.

13. A negative resistance oscillator comprising a resonant chamber having a sidewall of predetermined lateral dimensions and two end walls longitudinally spaced from each other, there being a hole through said sidewall, an abutment at the inner end of said hole, a conducting disk in said hole and separated from said wall and from said abutment by insulation, a diode having two ends in said chamber and attached with one of its ends to one of said end walls, a conductor from said disk to the other end of said diode and from said disk to a voltage supply point, and said disk, said insulation, said abutment and the adjacent portions of said chamber comprising a folded radial transmission line having a length of about one-quarter of a wavelength at the frequency of resonance of said chamber.

14. The negative resistance oscillator of claim 13 in which a tuning element having a longitudinal dimension determined by the resonant frequency of said oscillator is mounted on said diode at the other one of its ends and extends in close proximity to said sidewall of said chamber to provide a thin annular gap between said tuning element and said sidewall for the extraction of R.F. power.

15. The negative resistance oscillator of claim 14 in which a portion of said one end wall is fixed and a portion thereof is moveable and in which said diode is mounted on said fixed portion of said one end wall.

16. The negative resistance oscillator of claim 15 in which the moveable portion of said one end wall surrounds said fixed portion thereof.

* * * * *